(12) United States Patent
Simon et al.

(10) Patent No.: US 9,803,996 B2
(45) Date of Patent: Oct. 31, 2017

(54) SYSTEM FOR ASCERTAINING THE NUMBER OF REVOLUTIONS OF A ROTATIONALLY MOUNTED SHAFT, AND METHOD FOR ASCERTAINING THE NUMBER OF REVOLUTIONS OF A ROTATIONALLY MOUNTED SHAFT

(71) Applicant: SEW-EURODRIVE GMBH & CO. KG, Bruchsal (DE)

(72) Inventors: Olaf Simon, Bruchsal (DE); Gunnar Meyrowitz, Oldenburg (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 16 days.

(21) Appl. No.: 14/410,442

(22) PCT Filed: Jun. 17, 2013

(86) PCT No.: PCT/EP2013/001786
§ 371 (c)(1),
(2) Date: Dec. 22, 2014

(87) PCT Pub. No.: WO2014/000869
PCT Pub. Date: Jan. 3, 2014

(65) Prior Publication Data
US 2015/0153203 A1 Jun. 4, 2015

(30) Foreign Application Priority Data

Jun. 28, 2012 (DE) .................. 10 2012 012 874

(51) Int. Cl.
*G01D 5/14* (2006.01)
*G01P 3/481* (2006.01)
(Continued)

(52) U.S. Cl.
CPC ............... *G01D 5/142* (2013.01); *G01D 3/08* (2013.01); *G01D 9/005* (2013.01); *G01P 3/4815* (2013.01); *G01R 19/00* (2013.01)

(58) Field of Classification Search
CPC .......... G01D 5/142; G01D 9/005; G01D 3/08; G01R 19/00; G01P 3/4815
(Continued)

(56) References Cited

U.S. PATENT DOCUMENTS 2,235,393 A * 3/1941 Baker .................. G01M 1/16
408/2
4,538,082 A * 8/1985 Hinke ................... F02P 7/0672
310/152

(Continued)

FOREIGN PATENT DOCUMENTS

CN 1979097 A 6/2007
DE 2931329 A1 2/1981
(Continued)

OTHER PUBLICATIONS

Yu. V. Filatov, D. P. Loukianov, and R. Probst; Dynamic angle measurement by means of a ring laser; Metrologia, 1997, 34, 343-351.*

(Continued)

*Primary Examiner* — Patrick Assouad
*Assistant Examiner* — Christopher McAndrew
(74) *Attorney, Agent, or Firm* — Andrews Kurth Kenyon LLP

(57) ABSTRACT

System for ascertaining the number of revolutions of a rotationally mounted shaft, and method for ascertaining the number of revolutions of a rotationally mounted shaft, a permanent magnet being connected to the shaft in a torsionally fixed manner, the signal voltage generated by a microgenerator situated in an operative connection with the per- (Continued)

manent magnet being supplied to an energy buffer, especially via a rectifier to a capacitor, a memory device for storing the number of revolutions being supplied from the energy buffer, the signal voltage of the microgenerator in particular being supplied to a counting logic device, which is supplied from the energy buffer and is connected to the memory device for reading out the respective old numerical value of the revolutions and for storing the respective newly ascertained numerical value of the revolutions.

23 Claims, 1 Drawing Sheet

(51) Int. Cl.
  *G01D 3/08* (2006.01)
  *G01D 9/00* (2006.01)
  *G01R 19/00* (2006.01)

(58) Field of Classification Search
  USPC ..................................................... 324/207.2
  See application file for complete search history.

(56) References Cited

U.S. PATENT DOCUMENTS

| | | | | |
|---|---|---|---|---|
| 5,008,649 | A * | 4/1991 | Klein | G08B 13/2474 |
| | | | | 324/260 |
| 5,148,106 | A * | 9/1992 | Ozawa | G01D 5/145 |
| | | | | 324/207.12 |
| 5,632,169 | A * | 5/1997 | Clark | E05B 47/0688 |
| | | | | 340/5.31 |
| 5,640,862 | A * | 6/1997 | Remenicky | E05B 47/0688 |
| | | | | 340/5.55 |
| 7,098,654 | B2 | 8/2006 | Mehnert et al. | |
| 7,471,080 | B2 | 12/2008 | Sasaki et al. | |
| 7,598,733 | B2 * | 10/2009 | Mehnert | G01D 5/145 |
| | | | | 324/207.15 |
| 8,283,914 | B2 | 10/2012 | Mehnert et al. | |
| 2007/0152856 | A1 | 7/2007 | Yamamoto | |
| 2011/0184691 | A1 * | 7/2011 | Mehnert | G01D 5/145 |
| | | | | 702/151 |
| 2012/0022828 | A1 | 1/2012 | Schneider et al. | |
| 2012/0047894 | A1 * | 3/2012 | Ward | F01B 1/08 |
| | | | | 60/716 |

FOREIGN PATENT DOCUMENTS

| | | |
|---|---|---|
| DE | 10259223 B3 | 2/2004 |
| DE | 102004062448 A1 | 1/2006 |
| DE | 10 2007 062 780 | 7/2008 |
| DE | 102009015711 A1 | 10/2010 |
| EP | 1 550 845 | 7/2005 |
| EP | 2 221 587 | 8/2010 |

OTHER PUBLICATIONS

International Search Report, dated Oct. 2, 2013, issued in corresponding International Application No. PCT/EP2013/001786.
D. Dlugos, "Wiegand Effect Sensors Theory and Applications".
M. Davis, "Brushing Up on Wiegand: the Man, the Effect, and the Wire that Changed Engineering", Machine Design, Aug. 1, 2011.
International Preliminary Report on Patentability, dated Jan. 19, 2015, issued in corresponding International Application No. PCT/EP2013/001786.

* cited by examiner

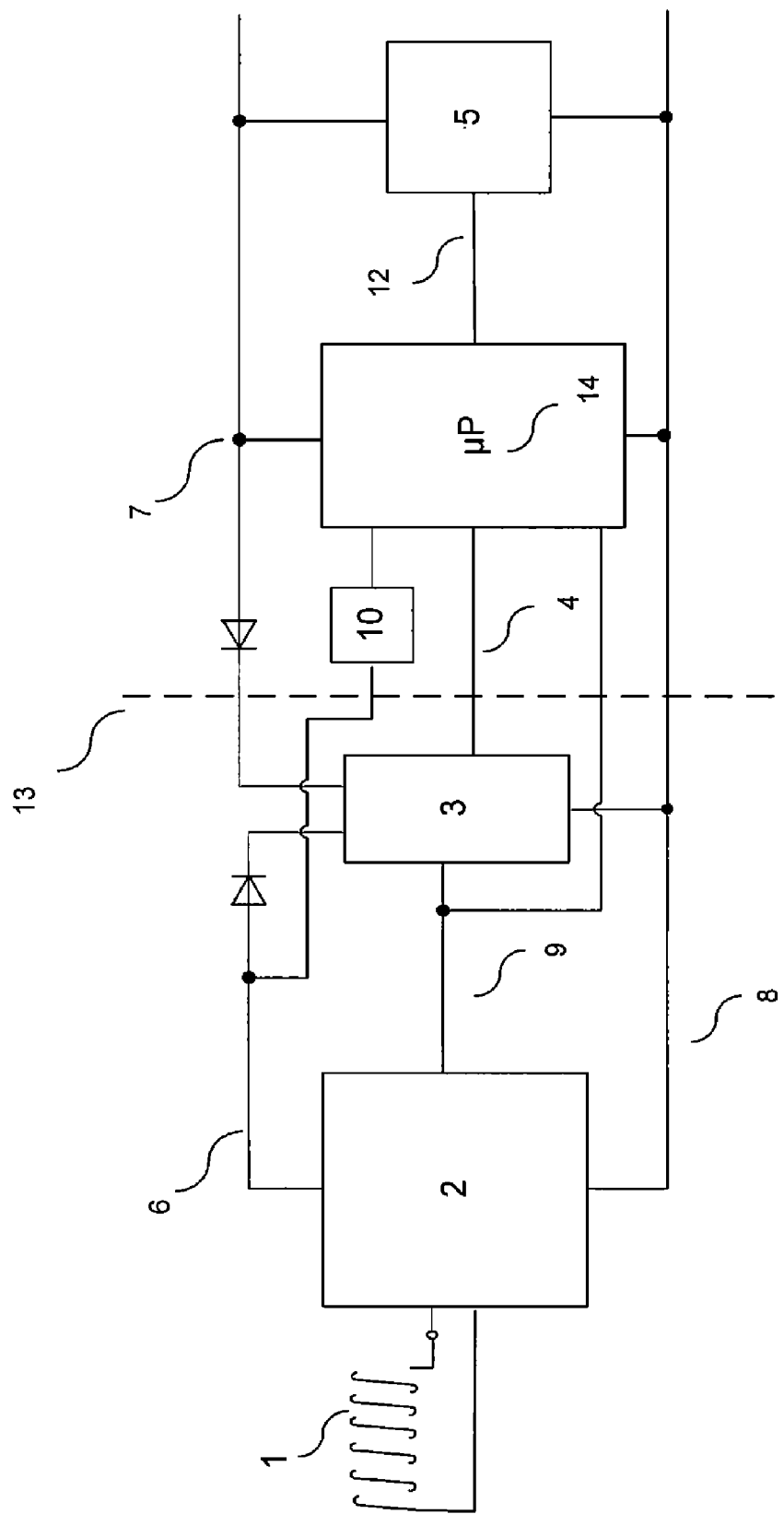

SYSTEM FOR ASCERTAINING THE NUMBER OF REVOLUTIONS OF A ROTATIONALLY MOUNTED SHAFT, AND METHOD FOR ASCERTAINING THE NUMBER OF REVOLUTIONS OF A ROTATIONALLY MOUNTED SHAFT

FIELD OF THE INVENTION

The present invention relates to a system for ascertaining the number of revolutions of a rotationally mounted shaft and to a method for ascertaining the number of revolutions of a rotationally mounted shaft.

BACKGROUND INFORMATION

It is generally known that the angular position of the shaft can be ascertained with the aid of an angle sensor. For each rotation, finely resolved angular values are ascertainable, such as at a resolution of 1°. The number of revolutions is the number of rotations fully executed by the shaft. The absolute angular position is defined by the value of the number of revolutions and the finely resolved angular position.

Used as microgenerator is either a Wiegand wire, also known as pulse wire, or alternatively, a magnetically mechanically preloadable and then magnetically-mechanically biasable system, which induces voltage in a coil when the system is triggered is used as microgenerator. Especially when systems provided with a Wiegand wire are involved, the triggering is brought about by a different magnetic pole than the biasing.

SUMMARY

Therefore, the present invention is based on the objective of further developing a system for ascertaining the number of revolutions of a rotationally mounted shaft, in which the error rate is to be reduced.

Important features of the present invention in the system for ascertaining the number of revolutions of a rotably mounted shaft are that a permanent magnet is connected to the shaft in a torsionally fixed manner, the signal voltage generated by a micro-generator situated in an operative connection with the permanent magnet being supplied to an energy buffer, especially via a rectifier to a capacitor, a memory device for storing the number of revolutions being supplied from the energy buffer, the signal voltage of the microgenerator in particular being supplied to a counting logic device, which is supplied from the energy buffer and connected to the memory device for reading out the respective old numerical value of the revolutions and for storing the respective newly ascertained numerical value of the revolutions, the memory device in particular being designed to provide long-term stability and/or being designed in FRAM technology, the permanent magnet in particular being situated in the sensitive region of the microgenerator, an angular sensor for ascertaining the rotational position of the shaft, especially the angle of rotation, being connected by means of a signal line to a computer, e.g., a microcontroller or microprocessor, the computer analyzing the voltage applied at the energy buffer, the computer in particular having a means for analyzing the voltage applied at the energy buffer and/or being connected to such a means, especially via a data exchange link.

This has the advantage that an energy-autonomous determination of the number of revolutions is able to be performed on the one hand, but a control or monitoring of the number of revolutions is able to be carried out on the other, in that a computer having an external supply can be used for monitoring and analyzing the signals of the microgenerator, i.e., especially the Wiegand wire or pulse wire. That is to say, it is monitored in this manner whether a signal pulse generated by the microgenerator is a runt pulse because the shaft's direction of rotation was modified in the angular range of the biasing and/or triggering, or whether a defect has occurred. It is detectable, in particular, whether the signal pulse has a level that conforms to the configuration or has sufficient energy content. If this is not the case, then said signal pulse either is developed as a runt pulse, or a defect or misalignment of the sensor has occurred. A warning message can be triggered with such a defect even before a malfunction has occurred.

In one advantageous development, the microgenerator is developed as a Wiegand wire or includes a Wiegand wire. This is advantageous insofar as no mechanical components that are subject to wear are required.

If a Wiegand wire in the form of a Wiegand sensor is used as a microgenerator, it is possible that signal pulses having a low signal amplitude occur even during a faultfree operation, when a change in the direction of rotation takes place. This is the case if the Wiegand wire is not biased or is not fully biased after a pulse has occurred and triggering into the opposite magnetic field direction takes place nevertheless because of the change in the direction of rotation. Such signal pulses are referred to as runt pulses. To prevent the signal monitoring device from interpreting such pulses as a malfunction, only pulses in which complete biasing has previously been determined may be analyzed. Full biasing can be determined in that a certain angular value of the angle sensor finely resolving the rotary position of the shaft has been exceeded, especially the parallelism of the magnetic field triggering the Wiegand sensor, and the Wiegand sensor.

In one advantageous development, the micro generator is developed as a pulse wire. This has the advantage that a component can be used that has no wear and is able to be produced in a cost-effective manner.

In one advantageous development, a signal line, especially for a data exchange, is situated between the computer and the memory device. This is advantageous insofar as the value stored in the memory device can be read out by the computer and analyzed there. In particular the starting value, i.e., offset value, of the number of revolutions at the start of the computer operation is able to be read out from the memory device and can be used as starting value in the computer. Furthermore, during the operation, a continuously repeated comparison is able to be performed between the value of the number of revolutions ascertained in the computer and the value of the number of revolutions stored in the memory device.

In one advantageous development, the angle sensor and the computer are supplied by one voltage source, especially a voltage source that does not supply the counting logic device and the energy buffer. This has the advantage of allowing an external supply for the computer.

In one advantageous development, the angle sensor includes a Hall-effect sensor, which is mechanically linked to the permanent magnet, or the angle sensor is a resolver connected to the shaft or an incremental encoder. This is advantageous insofar as a cost-effective and high-resolution system can be used.

Important features in the method for ascertaining the number of rotations of a rotationally mounted shaft are that a permanent magnet is connected to the shaft in a torsionally fixed manner, the signal voltage generated by a micro-generator situated in an operative connection with the permanent magnet is supplied to an energy buffer, especially via a rectifier to a capacitor, a memory device, in which the currently ascertained values of the number of revolutions are stored, is supplied from the energy buffer, the signal voltage of the microgenerator in particular is supplied to a counting logic device, which is supplied from the energy buffer and connected to the memory device for reading out the respective old numerical value of the revolutions and for storing the respective newly ascertained numerical value of the revolutions, the memory device is designed for long-term stability, in particular, and/or is designed in FRAM technology, the permanent magnet in particular is situated in the sensitive region of the micro-generator, the rotational angle of the shaft is determined using an angle sensor and forwarded to a computer, the computer analyzes the voltage applied at the energy buffer, the rotational angle detected by the angle sensor being taken into account in the process.

This has the advantage that the value of the number of revolutions is storable in the section of the circuit system that is self-sufficient in terms of energy, and that this value is able to be monitored and controlled by the externally supplied computer, at least during the particular time period in which externally supplied energy is available. Defects in the system are therefore detectable.

In one advantageous development, the voltage curve occurring at the energy buffer is used to determine a value of at least one characteristic quantity, especially a state variable, of the voltage curve, and an error signal or an error report is triggered if a critical limit value, i.e., a defined, especially predefined, limit value, is not met or exceeded.

In one advantageous development, the maximum value of the voltage pulse is used as the characteristic quantity.

In one advantageous development, multiple voltage pulses are measured one after the other, and their characteristic values are subjected to a statistical analysis. If the statistical characteristic values do not attain defined limit values or exceed them, then an error signal or an error report will be generated.

In one advantageous development, the average value and/or the standard deviation and/or the average value of the amount of the difference from the average value, i.e., the average amount deviation, are/is used as statistical characteristic values.

In this way the average value is determined from the corresponding values of the characteristic quantities determined previously, the measure in particular being a function of a statistical variable, especially a standard deviation, a trivial or higher moment of a distribution function or the like, the measure in particular corresponding to the statistical moment multiplied by a factor, the moment in particular being the standard deviation. This has the advantage that the comparison with a statistical quantity, such as the average value, makes it possible to ascertain whether the currently analyzed pulse has an excessive deviation and thus is caused by a defect or is a "runt".

A state variable in this document describes a macroscopic physical variable that characterizes the state of the system of the present invention. Among such variables, for instance, are the form of the signal pulse generated by the microgenerator or one or more parameter(s) of this pulse, such as the voltage-time-area, the maximum value, the maximum value of the time derivation of the voltage curve, etc.

In one advantageous development, the pulse-type voltage curve arising at the energy buffer is used to ascertain a value of a characteristic quantity, especially a state variable, of the pulse-shaped voltage curve and either the instantaneous voltage pulse will not be used for ascertaining the number of revolutions when a change in the direction of rotation of the shaft has been detected by the angle sensor in an angular section and/or in a time segment associated with the voltage pulse, and when a critical, especially predefined, measure of a deviation of the value from an average value is exceeded, or otherwise, an error signal is triggered if the critical, especially predefined, measure of the deviation of the value from an average value is exceeded, the average value being determined from the corresponding values of the characteristic quantities determined previously, the measure in particular being a function of a statistical variable, especially a standard deviation, a higher moment of a distribution function or the like, the measure in particular corresponding to the statistical moment multiplied by a factor, the moment in particular being the standard deviation. This has the advantage that a defect in the system is able to be detected and the safety is therefore able to be increased.

In one advantageous development, the characteristic quantity is an amplitude, i.e., a maximum value, of the voltage signal or it is the voltage value at a specified point in time following the start of the voltage pulse, and/or the characteristic quantity is an averaged or maximum voltage change rate, and/or the characteristic quantity is an averaged or maximum voltage-time area. This has the advantage that it is not only possible to analyze the amplitude of the instantaneous pulse, but also the characteristic of the pulse signal.

In one advantageous development, a time segment, characterized by a trigger pulse, i.e., in particular an approximate instant, of the pulse-shaped voltage characteristic is analyzed, especially by the computer, and used for ascertaining the value of the characteristic quantity of the pulse-shaped voltage characteristic. This has the advantage that the trigger pulse and the voltage of the particular instantaneous pulse that arises in its triggering are analyzable and thus the energy content of the pulse is able to be monitored, as well.

In one advantageous development, the sampling values, converted into digital values, of the pulse-shaped voltage characteristic are forwarded to a cyclically operated memory device, and the analysis of the pulse-shaped voltage characteristic is realized by analyzing the values stored in the cyclical memory device, especially after the trigger pulse has been received. This is advantageous insofar as a continuous analog-to-digital conversion can be performed and an analysis is able to be carried out only after the trigger pulse has arrived. As a result, the voltage rise that occurs already prior to the arrival of the trigger pulse is able to be evaluated, as well, so that improved monitoring may be carried out. The storage capacity of the cyclical memory device, i.e., the number of values the cyclical memory device is able to store, can be set up in such a way that the relevant time segment of the pulse generated by the Wiegand wire is able to be monitored. Since the temporal pulse length is independent of the rotational speed of the shaft and thus never varies, the storage capacity may be adapted to the pulse length.

In one advantageous development, the trigger pulse is generated by the exceeding of a critical value by the pulse-shaped voltage characteristic. This has the advantage that this value is able to be generated and also analyzed by simple means, so that the energy content of the pulse generated by the microgenerator is able to be monitored, as well.

In another advantageous development, the signal of the micro-generator, which initiates the counting operation in the non-volatile memory of the revolution counter, is used as trigger pulse. Since this signal is already provided for the basic function of the revolution counter, no additional signals that are used for monitoring the pulse signal need to be generated.

In one advantageous development, the instantaneous number of revolutions is read out from the memory device for storing the number of revolutions at the beginning of the initial operation or at the start of the electrical supply of the computer, and used by the computer as the initial value for the rotational speed, the characteristic of the angular position, ascertained with the aid of the angle sensor, being used to determine the number of revolutions performed following the start, and the sum of this number of revolutions and the initial value being stored in the computer as the individual instantaneous number of revolutions. This has the advantage that monitoring of the number of revolutions is able to be carried out and the safety is therefore increased. For the redundant—at least during an operation—ascertaining of the number of revolutions makes it possible to improve the reliability and to detect a defect of the system. The numerical value of the non-volatile memory can possibly be corrected by the value of the redundant determination, by way of overwriting.

BRIEF DESCRIPTION OF THE DRAWING

The FIGURE schematically illustrates a switching circuit according to the present invention.

In a drive component such as a transmission, clutch, brake and/or an electric motor, a permanent magnet, whose magnetization direction is aligned in the radial direction, is connected to the shaft at an axial end of a rotationally mounted shaft. The permanent magnet is preferably disposed at the end face of the axial shaft end. Across from the permanent magnet, i.e., spaced apart from the end face of the shaft end, is a circuit board, which on the one hand includes at least one Wiegand wire 1, i.e., a pulse wire, and on the other hand has at least one Hall-effect sensor, especially a cross-Hall-effect sensor. The circuit board is firmly joined to a housing component.

With the aid of the Hall-effect sensor, which is implementable as angle sensor 5, an angle of the rotational position of the shaft is able to be ascertained. However, an external supply source is required to supply the angle sensor and a computer 14. Signals from sensor 5 are forwarded to computer 14 via signal line 12.

The signals from sensor 5 are analyzed in computer 14 and arithmetic operations are executed in the process as well, so that the individual instantaneous angular value of the rotational position of the shaft is able to be ascertained.

Wiegand wire 1 is situated on the circuit board in such a way that the revolutions of the shaft are detectable. In the process, the Wiegand wire is magnetically biased during the rotary motion by a first pole, e.g., the north pole, of the permanent magnet, and Wiegand wire 1 is triggered when approaching the other pole, e.g., the south pole. In doing this, the Wiegand wire generates a pulse, i.e., a pulse-shaped voltage characteristic. Subsequently, reverse biasing of the wire by the other pole on the rotationally mounted shaft, e.g., the south pole, takes place. When approaching the next opposite magnetic pole when viewed from the circumferential direction, that is to say, the north pole, for instance, a pulse having an inverted sign is triggered as well. After biasing by this magnetic pole, the described series of pulse triggerings is repeated as the rotary motion of the shaft continues. Depending on the number of north and south poles in the system, a minimum of two pulses and a maximum of $2^n$ pulses are triggered for each full revolution of the shaft, n denoting the number of poles in the circumferential direction. The generated pulses are rectified with the aid of a rectifier, preferably a bridge rectifier, and transmitted to a capacitor, i.e., an energy storage device, so that only pulses of a single polarity are produced, the energy is stored and no discharging of the energy can occur in the Wiegand sensor. Since the pulse contains enough energy to supply the energy required for counting the pulses of the Wiegand wire, an external supply of the correspondingly associated part of the electronic circuit on the circuit board is not necessary.

Wiegand wire 1 may also be called a pulse wire.

The pulse of Wiegand wire 1 is forwarded to a signal processing means 2, which is equipped with a rectifier, an energy buffer, especially capacitor, and a counting logic including a communications interface to a memory device 3.

The individual number of revolutions ascertained in this manner is stored in memory device 3, especially in the memory developed as FRAM.

The pulse signal of Wiegand wire 1, rectified by the rectifier, is transmitted to the energy buffer, i.e., the capacitor. As soon as it has attained a critical voltage value following the arrival of the pulse, the number of revolutions is incremented or decremented. To detect the voltage applied at the energy buffer, the associated voltage signal is is also forwarded to computer 14, especially the microcontroller, by way of a sampling means 10 for sampling voltage 6 at the energy buffer. Sampling means 10 is an analog-to-digital converter, which is either disposed in computer 14 in integrated fashion, so that the voltage signal has to be routed only to an A/D input, i.e., the analog input of the analog-to-digital converter integrated into the computer, or sampling means 10 is an analog-to-digital converter which is disposed separately from computer 14. Therefore, the voltage applied at the energy buffer and converted into digital form is monitored within the computer for an exceedance of a critical voltage value. However, this requires a supply of computer 14 from an external voltage source, since the electrical pulse power generated by the Wiegand wire is insufficient for operating computer 14, especially at low rotational speeds of the shaft, but is sufficient only for supplying the counting logic and memory device 3.

In addition, a further analysis of the characteristic of the voltage pulse generated by the Wiegand wire is possible. The characteristic, i.e., the pulse shape, is recorded and analyzed by computer 14. In particular characteristic data, such as the averaged or maximum amplitude, the averaged or maximum voltage change rate, or parameters such as the voltage value at the time when writing to memory device 3 takes place.

The characteristic data of the previously occurred pulses are stored in the memory device and subjected to a statistical analysis. In particular, the average value associated with the particular characteristic datum, and/or an associated standard deviation or some other associated statistical moment are/is ascertained. The corresponding characteristic data of the most recently analyzed voltage pulse are compared with these statistical values, and warning information or an error signal is triggered when a critical deviation is exceeded.

That is to say, an average value of the amplitudes of the previously occurred and sampled pulses is ascertained in computer 14 and the amplitude of the particular instantaneous pulse is compared with this average value. If the associated deviation is greater than the standard deviation or greater than the standard deviation multiplied by a factor, then an error signal will be triggered. In the other case, the updated average value is ascertained and stored. The factor has a value between 0.5 and 3.

A corresponding procedure is used for further characteristic data of the pulse.

Thus, each pulse is able to be analyzed using the statistically analyzed data of the pulses that preceded it.

A value that corresponds to the time derivation of the temporal characteristic of the voltage values of the pulse is accordingly used as voltage change rate. For this purpose the individual voltage differential of two consecutively occurring sampling values of the pulse is ascertained and used for determining the quotient of this voltage differential and the time interval of the two sampling values. For each pulse the maximum value of the voltage change rate is determined therefrom, and/or an averaged value thereof, which is determined from the ascertained voltage-change rate values of the pulses that occurred and were sampled previously.

The average value of the previously occurred maximum voltage change rate values is determined and the deviation of the instantaneous voltage change rate value from the average value is determined again. If the associated deviation is greater than the standard deviation or greater than the standard deviation multiplied by a factor, then an error signal will be triggered. In the other case, the updated average value is ascertained and stored. The factor preferably has a value between 0.5 and 3.

For the generation of an error signal, the average value is alternatively checked to determine whether it exceeded or dropped below fixedly defined limit values.

A corresponding process is used for the averaged value of the voltage change rate.

The voltage that exists at the energy buffer when writing to memory device 3 is also recorded for each pulse and the deviation from the average value of the previously occurred corresponding voltages is ascertained in a similar manner.

In addition, a failure probability of the system can be determined from the individually ascertained deviations from the average value.

Moreover, angle sensor 5 makes it possible to differentiate between faulty pulses and pulses that occur as "runts".

Faulty pulses occur because of the destruction of a component, for example, or because of distances between the permanent magnet disposed on the shaft and Wiegand wire 1 that are too large. Such errors trigger pulses whose energy and voltage amplitude lie below the otherwise average value and below an individual critical value. If such a design- or function-related defect is therefore present, an error signal must be triggered.

The critical values mentioned in this document are predefinable threshold values. For example, they are specified in the initial operation or even already during the manufacture, i.e., stored in a memory device of computer 14. The memory device is preferably a memory for the long-term storage of the values.

But even if the system is functional, it is possible that a pulse in the form of a runt occurs. For Wiegand wire 1 needs to be magnetically biased to a sufficient extent prior to triggering. However, when the shaft with the provided permanent magnet performs a change in direction in the particular angular range in which the triggering takes place, it may happen that complete biasing is not achieved prior to the triggering. Such weakly developed pulses, which are also known as runts, are able to be detected by the system according to the present invention. This is so because the rotary motion is monitored for this purpose by angle sensor 5, which allows a high resolution of the angle of rotation. As a result, a change in direction in the region of the angular triggering range is detectable and the runt can therefore be excluded in the analysis in computer 14.

Detected pulses, in which sufficient biasing has not been detected previously, are then excluded from the analysis for the error detection and for calculating the statistical data. That is to say, especially when no change in direction has occurred and too weak a pulse is present nevertheless, a defect or error of the system is inferred, so that computer 14 triggers an error signal.

Important in the present invention is that an angle sensor 5 is used not only for making the angle of rotation of the shaft ascertainable in a finely resolved form, but is used also for monitoring the pulses generated by Wiegand wire 1.

The signals from angle sensor 5 can be utilized for ascertaining the angular position, i.e., the angle-of-rotation position of the shaft, and also for ascertaining the number of revolutions executed. However, the counting of the revolutions using angle sensor 5 can be carried out only as long as it and the analyzing computer 14 are supplied with energy. When the supply voltage fails, it is impossible to ascertain the number of revolutions. When using Wiegand wire 1 and memory device 3, on the other hand, the number of revolutions can be determined in an energy-autonomous manner. When the voltage supply of angle sensor 5 is switched on, or thereafter, computer 14 uses as starting value the number of revolutions currently recorded in memory 3.

Through the continuous comparison of the instantaneous number of revolutions ascertained by the independent system and angle sensor 5, it is possible to monitor for errors that have occurred, so that the reliability is able to be increased overall. In addition, if the faulty value is detectable, it is also possible to implement a mutual correction of the revolution numbers.

In the FIGURE, signal line 4 of the communications interface is disposed between computer 14 and memory device 3.

The voltage at the energy buffer can be tapped directly via signal line 6.

The external supply voltage has an upper potential 7 and a lower potential 8. Signal line 9 connects signal processing means 2, especially the counting logic of signal-processing means 2, to memory device 3.

Signal line 12 for transmitting the angle sensor signals to computer 14 connects angle sensor 5 to computer 14.

Symbolically indicated separating line 13 represents the separation between the self-sufficient, i.e., energy-autonomous, and externally supplied part of the circuit system.

Computer 14 is preferably developed as a microprocessor or microcontroller, which has an analog input, especially including an integrated analog-to-digital converter.

Sampling means 10 has high resistance on the input side, i.e., high resistance toward the energy buffer. As a result, the loading of the energy buffer by sampling means 10 is negligible.

Memory device 3 is a memory device that provides long-term stability. This means that the stored values remain in the memory device for more than a week even without a voltage supply. The memory device is preferably developed in FRAM technology. The numerical revolution values thus remain preserved in the long term even when no voltage is supplied and even if the Wiegand wire generates no pulses and therefore does not supply any energy to the energy buffer either.

The shaft with the permanent magnet linked to it in torsionally fixed manner is rotationally mounted with respect to the rest of the system according to the present invention, i.e., sensor 5, computer 14, sampling means 10, Wiegand wire 1, and memory device 3. These components are preferably disposed on a circuit board which is permanently connected to a system component with respect to which the shaft is rotationally mounted.

In further exemplary embodiments according to the present invention, sampling means 10 is developed to include an impedance transformer and/or a comparator and/or an amplifier circuit, especially in addition to an analog-to-digital converter or instead of one. Sampling means 10 triggers a trigger pulse when a minimum voltage has been reached at the energy buffer. This trigger pulse is forwarded to computer 14, which starts the recording of the voltage pulse once the trigger pulse has been received at computer 14. Upon triggering of the trigger pulse it is thus the case that the characteristic of the voltage applied at the energy buffer begins to be recorded. Once the predefined time period or a predefined maximum number of measurements has elapsed, i.e., recordings of the sampling values of the voltage characteristic, or after a drop below a critical voltage value has occurred, the recording of the voltage characteristic is ended.

In other exemplary embodiments of the present invention, the voltage applied to the energy buffer is sampled on a continuous basis and stored in a cyclically operated memory device. The trigger pulse for the storing of the sampled values is implemented by the voltage applied to the energy buffer. As soon as it exceeds a critical value, the signal processing means supplies corresponding information, i.e., trigger information, this information being transmitted via a signal line from signal processing means 2 to computer 14, especially in the form of a data-bus and/or field-bus communications protocol. After the trigger information has been received, the sampling values stored in the cyclical memory device are analyzed. In this way the initial voltage characteristic of the pulse analyzed by the Wiegand wire is also possible. Even sampling values that were recorded prior to the arrival of the trigger information are able to be analyzed. Especially the initial steepness, i.e., the initial rate of change in the voltage, is analyzable. In addition, when writing to the memory, the voltage is especially important, because it requires a great amount of electrical power and thus also energy overall. Since the instant of the write command leads to the trigger being triggered, it is possible to perform a very accurate measurement of the critical voltage values in this context.

In further exemplary embodiments of the present invention, instead of Wiegand wire 1, another microgenerator may be used.

In further exemplary embodiments according to the present invention, angle sensor 5 is not developed as a Hall-effect sensor but as another angle sensor connected to the shaft, such as an inductively operating resolver or an incremental encoder operating with an encoded disk and according to an optical operating principle. Computer 14 then receives the signals from the angle sensor, or computer 14 exchanges data with a higher-level computer, which in turn is connected to the angle sensor for a data exchange.

LIST OF REFERENCE NUMERALS

1 Wiegand wire, pulse wire, and/or microgenerator
2 signal processing means
3 memory device for the number of revolutions
4 communications interface
5 angle sensor, especially including a Hall-effect sensor
6 voltage at the energy buffer
7 potential of the external supply voltage
8 ground, lower potential of the external supply voltage
9 signal line between the counting logic of signal processing means 2 and memory device 3
10 sampling means for sampling voltage 6 at the energy buffer
12 signal line for transmitting the angle sensor signals to computer 14
13 separating line between the self-supplied and externally supplied part of the circuit system
14 computer, especially microprocessor
signal for triggering a counting operation at the counter with a non-volatile memory

The invention claimed is:

1. A system for ascertaining a number of revolutions of a rotationally mounted shaft, comprising:
 a permanent magnet connected to the shaft in a torsionally fixed manner;
 a microgenerator situated in an operative connection with the permanent magnet, wherein a signal voltage generated by the microgenerator is supplied to an energy buffer, wherein the microgenerator is adapted to operate in an energy-autonomous manner;
 a memory device for storing the number of revolutions supplied from the energy buffer;
 a counting logic device, wherein:
  the signal voltage of the microgenerator is supplied to the counting logic device, and
  the counting logic device is supplied from the energy buffer and is connected to the memory device for reading out a respective old numerical value of the revolutions and for storing a respective newly ascertained numerical value of the revolutions,
  the memory device is at least one of designed for long-term stability and designed in FRAM technology, and
 an angle sensor for ascertaining a rotational position of the shaft and connected via a signal line to a computer, wherein:
  the computer analyzes a voltage applied at the energy buffer, the computer one of (1) has an arrangement for analyzing the voltage applied at the energy buffer, and (2) is connected to the arrangement for analyzing the voltage, a voltage characteristic occurring at the energy buffer is used for ascertaining a value of a characteristic quantity corresponding to a state variable of the voltage characteristic, an error signal is triggered when a critical measure corresponding to a predefined measure of a deviation of a value from an average value is exceeded, the average value is determined from corresponding values of characteristic quantities determined previously, and the measure is a function of a statistical variable or a higher moment of a distribution function.

2. The system as recited in claim 1, further comprising a rectifier, wherein:
the energy buffer includes a capacitor, and
the signal voltage is supplied via the rectifier to the capacitor.

3. The system as recited in claim 1, wherein the angle sensor ascertains the rotational position as an angle of rotation.

4. The system as recited in claim 1, wherein the computer is connected to the arrangement for analyzing the voltage via a data exchange link.

5. The system as recited in claim 1, wherein the microgenerator is a Wiegand wire or includes a Wiegand wire.

6. The system as recited in claim 1, wherein the microgenerator is a pulse wire.

7. The system as recited in claim 1, further comprising a signal line for the exchange of data that is disposed between the computer and the memory device.

8. The system as recited in claim 1, wherein the angle sensor and the computer are supplied by one voltage source.

9. The system as recited in claim 8, wherein the counting logic and the energy buffer are not supplied from the voltage source.

10. The system as recited in claim 1, wherein the angle sensor includes one of:
a Hall-effect sensor that is mechanically linked to the permanent magnet, and
a resolver connected to one of the shaft and an incremental encoder.

11. A method for ascertaining a rotational speed of a rotationally mounted shaft, comprising:
connecting a permanent magnet to the shaft in a torsionally fixed manner;
generating a signal voltage by a microgenerator situated in an operative connection with the permanent magnet, wherein the microgenerator operates in an energy-autonomous manner;
supplying the signal voltage to an energy buffer;
supplying a memory device from the energy buffer, the memory device storing currently ascertained numerical values of revolutions of the shaft, wherein the memory device is at least one of designed for long-term stability and designed in FRAM technology; and
supplying the signal voltage of the microgenerator to a counting logic device, which is supplied from the energy buffer and is connected to the memory device for reading out respective old numerical value of the revolutions and for storing respective newly ascertained numerical value of the revolutions, wherein:
the rotational angle of the shaft is determined using an angle sensor and forwarded to a computer,
the computer analyzes the signal voltage applied at the energy buffer, while taking an angle of rotation detected by the angle sensor into account,
a voltage characteristic occurring at the energy buffer is used for ascertaining a value of a characteristic quantity corresponding to a state variable of the voltage characteristic,
an error signal is triggered when a critical measure corresponding to a predefined measure of a deviation of a value from an average value is exceeded,
the average value is determined from corresponding values of characteristic quantities determined previously, and
the measure is a function of a statistical variable or a higher moment of a distribution function.

12. The method as recited in claim 11, wherein:
the energy buffer includes a capacitor, and
the signal voltage is supplied via a rectifier to the capacitor.

13. The method as recited in claim 11, wherein:
the statistical variable is a standard deviation, and
the measure corresponds to a statistical moment multiplied by a factor, the moment being the standard deviation.

14. The method as recited in claim 11, wherein for a pulse-shaped voltage characteristic occurring at the energy buffer, a value of a characteristic quantity, especially a state variable, of a voltage curve is ascertained from the voltage characteristic that occurs at the energy buffer, and an error signal is triggered when a critical value is not attained or exceeded.

15. The method as recited in claim 11, wherein for a pulse-shaped voltage characteristic occurring at the energy buffer, a value of a characteristic quantity, especially a state variable, of a voltage curve is ascertained from the voltage characteristic that occurs at the energy buffer, an average value of the characteristic quantity is ascertained for all pulses, or another statistical variable, such as the standard deviation or a higher distribution moment, and an error signal is triggered when the average value or the value of the other statistical variable drops below or exceeds a critical value.

16. A method for ascertaining a rotational speed of a rotationally mounted shaft, comprising:
connecting a permanent magnet to the shaft in a torsionally fixed manner;
generating a signal voltage by a microgenerator situated in an operative connection with the permanent magnet, wherein the microgenerator operates in an energy-autonomous manner;
supplying the signal voltage to an energy buffer;
supplying a memory device from the energy buffer, the memory device storing currently ascertained numerical values of revolutions of the shaft, wherein the memory device is at least one of designed for long-term stability and designed in FRAM technology; and
supplying the signal voltage of the microgenerator to a counting logic device, which is supplied from the energy buffer and is connected to the memory device for reading out respective old numerical value of the revolutions and for storing respective newly ascertained numerical value of the revolutions, wherein:
the rotational angle of the shaft is determined using an angle sensor and forwarded to a computer,
the computer analyzes the signal voltage applied at the energy buffer, while taking an angle of rotation detected by the angle sensor into account, a pulse-shaped voltage characteristic occurring at the energy buffer is used to ascertain a value of a characteristic quantity, corresponding to a state variable, of the pulse-shaped voltage characteristic, and one of (1) an instantaneous voltage pulse is not used for ascertaining the number of revolutions if a change in the direction of rotation of the shaft has been detected by the angle sensor in an angular section and/or in a time segment associated with the voltage pulse, and if a critical, especially predefined, measure of a deviation of the value from an average value is exceeded, and (2) an error signal is triggered if the critical measure of the deviation of the value from an average value is exceeded, the average value is determined from the corresponding values of the characteristic quantities determined previously, and the measure is a function of a statistical variable corresponding to a standard deviation or a higher moment of a distribution function.

17. The method as recited in claim 16, wherein the measure corresponds to a statistical moment multiplied by a factor, the moment being the standard deviation.

18. The method as recited in claim 11, wherein only pulses in which a sufficient bias voltage has been determined previously are at least one of analyzed and used for determining a number of revolutions.

19. The method as recited in claim 18, wherein the number of revolutions is determined by analyzing a characteristic of an angular value of a finely resolving angle sensor.

20. The method as recited in claim 11, wherein:

the characteristic quantity is one of:
- an amplitude corresponding to a maximum value,
- a maximum voltage change rate,
- a maximum voltage-time area of the voltage signal, especially of one of the pulse-shaped voltage characteristics,
- an averaged amplitude corresponding to the maximum value,
- an averaged voltage change rate, and
- an averaged voltage-time area of the pulse-shaped voltage characteristics.

21. The method as recited in claim 14, wherein to ascertain the value of the characteristic quantity of the pulse-shaped voltage characteristic, a time segment, corresponding to an instant and characterized by a trigger pulse, of the pulse-shaped voltage characteristic is analyzed by the computer.

22. The method as recited in claim 14, wherein sampling values, converted into digital values, of the pulse-shaped voltage characteristic are forwarded to a cyclically operated memory device, and an analysis of the pulse-shaped voltage characteristic is realized by analyzing values stored in the cyclical memory device after an arrival of a trigger pulse.

23. The method as recited in claim 22, wherein the trigger pulse is generated by an exceeding of a critical value by the pulse-shaped voltage characteristic.

* * * * *